United States Patent [19]

Motegi et al.

[11] Patent Number: 4,635,268
[45] Date of Patent: Jan. 6, 1987

[54] SEMICONDUCTOR LASER DEVICE HAVING A DOUBLE HETEROJUNCTION STRUCTURE

[75] Inventors: Nawoto Motegi, Kanagawa; Masaki Okajima, Kunitachi; Yuhei Muro, Yokohama, all of Japan

[73] Assignee: Kabushiki Kaisha Toshiba, Japan

[21] Appl. No.: 627,818

[22] Filed: Jul. 5, 1984

[30] Foreign Application Priority Data

Jul. 4, 1983 [JP] Japan ................. 58-121371

[51] Int. Cl.$^4$ ............................... H01S 3/19
[52] U.S. Cl. ......................... 372/45; 357/17; 372/46
[58] Field of Search .............. 372/45, 46, 44; 357/17

[56] References Cited

U.S. PATENT DOCUMENTS

| RE. 29,395 | 9/1977 | Yonezu | 148/175 |
|---|---|---|---|
| 3,920,491 | 11/1975 | Yonezu | 148/175 |
| 4,011,113 | 3/1977 | Thompson et al. | 148/175 |
| 4,329,660 | 5/1982 | Yano et al. | 372/46 |

FOREIGN PATENT DOCUMENTS

| 0042585 | 12/1981 | European Pat. Off. |
| 54-5273 | 5/1979 | Japan . |
| 57-5070 | 1/1982 | Japan . |
| 2105099 | 3/1983 | United Kingdom . |

OTHER PUBLICATIONS

H. Kressel et. "Large-Optical-Cavity (AlGa) As-GaAs Heterojunction Laser Diode: Threshold and Efficiency", *J. Appl. Phys.* vol. 43, No. 2, Feb. 1972, pp. 561-567.

Coleman et al., "Single-Longitudinal-Mode Metalorganic Chemical-Vapor-Deposition Self-Aligned GaAlAs-GaAs Double-Heterostructure Lasers", *Appl. Phys. Lett.*, 37(3) Aug. 1, 1980, pp. 262-263.

Chinn et al., "TE Modes of Graded-Index Large-Optical-Cavity Waveguides", *Optics Communications*, vol. 40, No. 3, Jan. 1, 1982, pp. 179-184.

Turley, "Optical Waveguiding in (In, Ga)(As, P) Inverted Rib Waveguide Lasers at 1.3 um Wavelength", *IEEE Journal of Quantum Electronics*, vol. QE-19, No. 7, Jul. 1983, pp. 1186-1195.

*Primary Examiner*—James W. Davie
*Attorney, Agent, or Firm*—Banner, Birch, McKie & Beckett

[57] ABSTRACT

A double heterojunction structure type semiconductor laser device comprising an active layer of GaAlAs in which the laser is excited, n-$Ga_{0.45}Al_{0.55}As$ clad layer and a p-$Ga_{0.45}Al_{0.55}As$ clad layer sandwiching the active layer between them in order to confine the laser light in the active layer, an n-GaAs current blocking layer disposed between the active layer and the p-$Ga_{0.45}Al_{0.55}As$ clad layer in order to confine current, and a p-$Ga_{0.63}Al_{0.37}As$ optical waveguide layer disposed between the active layer and the current confinement layer. The refractive index of the optical waveguide layer is greater than that of the both of the clad layers.

8 Claims, 8 Drawing Figures

SEMICONDUCTOR LASER DEVICE HAVING A DOUBLE HETEROJUNCTION STRUCTURE

BACKGROUND OF THE INVENTION

This invention relates generally to the field of lasers, and more particularly, is directed to a semiconductor laser device having a current confinement structure and a built-in waveguide structure.

With the increased use in recent years of optical disk devices, such as digital audio discs, video discs, and "document files," and the spread of fiber optic communications, mass production of semiconductor lasers, which provide the light source for these applications, has become essential. In the manufacture of conventional semiconductor lasers, a liquid phase expitaxial process (referred to hereafter as "LPE") is used for the crystal growth on the substrate. The LPE process, however, is not suitable for mass production of semiconductor lasers for the following reasons. Firstly, the LPE process may not be used with a large size semiconductor substrate. Second, the process is not suitable for sufficiently controling crystal growth on the substrate. Finally, the process requires a substantial amount of time to complete. For these reasons, other processes for crystal growth, such as molecular beam expitaxy (referred to hereafter as "MBE") and metalorganic chemical vapor deposition (referred to hereafter as "MOCVD"), have been used for mass production of semiconductor lasers.

A semiconductor laser having a suitable construction for manufacture by the MOCVD process is disclosed in Applied Physics Letters, Vol. 37, No. 3, p. 262 and is illustrated in FIG. 1. As shown in FIG. 1, current blocking layer (5), which confines the current to the direction parallel to the junction plane and controls the transverse mode of the laser, is provided in upper clad layer (4) formed on a flat active layer (3). The active layer is formed on an n-GaAs substrate through an n-GaAlAs clad layer (2). And p-GaAlAs clad layer (4) is covered with a p-GaAs contact layer. Further, the p-GaAs contact layer and the n-GaAs substrate have a pair of metal electrodes (7), (8), respectively. This type of laser device is simple to manufacture because current confinement and transverse mode control can be realized by self alignment of the structure. This laser, however, requires a second crystal growth on the GaAlAs clad layer (4). This second crystal growth is difficult to form by the LPE process and can only be formed by the MOCVD process.

For the semiconductor laser device explained above, n-type material is used as the substrate because n-type material is better than p-type material with respect to conductivity of the current blocking layer (5). Thus, the shorter the diffusion length of the minority carriers of the current blocking layer (5), the more effective the current confinement effect is realized. It is known that for III–V type compound semiconductor material such as GaAs, the diffusion length of a hole, which is the minority carrier of the n-type semiconductor layer, is shorter than that of an electron which is the minority carrier of the p-type semiconductor layer. Therfor, the use of an n-type material for the substrate of a semiconductor laser, with the current blocking layer (5) also being n-type material, provides more effective current confinement than possible with a substrate formed from p-type material.

It has been discovered by applicants that when the above described semiconductor laser is formed so as to generate a laser beam with a lasing wave-length of 0.8 micron, the thermal characteristics of the device is poor, with a pronounced increase in lasing threshold current as the temperature rises. The maximum temperature at which the laser remains capable of oscillation is low compared with ordinary lasers which cease to osicilate at about 100° C. Moreover, the working life of these semiconductor lasers is shortened under high temperature conditions.

Generally speaking, the temperature dependence $I_{fh}$ of the lasing threshold current $I_{th}$ of a semiconductor laser is expressed as follows:

$$I_{fh} = I_o \exp(T/T_o)$$

In the case of an ordinary laser, the characteristic temperature To is 140 to 180 Kevin (K). The To of the laser disclosed in the Applied Physics Letters described above was found to be only 80 to 100K. This means that the temperature dependence of such a laser is considerably high. Furthermore, the current confinement effect is not sufficient. The threshold current often rises above 100 mA and the differential quantum efficiency is small, below 15%. Moreover, a so-called "kink" occurs in the current/light output characteristics when light output is on the order of 5 to 10 mw. Thus, such a laser is not suitable for high power output.

SUMMARY OF THE INVENTION

It is, therefor, an object of the present invention to provide a semiconductor laser device having good temperature characteristics.

It is another object of the invention to provide a semiconductor laser device having sufficient current confinement effect.

It is a still further object of the invention to provide a semiconductor laser device suitable for various applications such as optical disk devices.

The aforementioned objects are achieved in accordance with the present invention by using a semiconductor laser device comprising an optical waveguide layer having a refractive index which is greater than the refractive index of either of the clad layers. The semiconductor laser device in accordance with the present invention has a thick p-type clad layer, of which the thickness is greater than 0.6 micron, disposed between an active layer and a current blocking layer so that the impurity concentration of the clad layer is maintained high. Thus a semiconductor laser device having good temperature characteristics and current confinement effect is obtained.

The poor temperature characteristics and current confinement effect in the type of laser device shown on FIG. 1 are due to the fact that it is not possible to raise to a sufficiently high level the concentration of p-type impurities in the p-type clad layer (4) adjoining the active layer (3). In GaAlAs lasers prepared by the MOCVD process, Zn is usually used as the p-type impurities. There is a close relationship between Zn density in the p-type clad layer (4) and characteristic temperature To which is indicative of the temperature dependence of the lasing threshold current (see for example, the paper by S. D. Hersee et al. in the Journal of Electronic Materials, Vol. 12, No. 2, P. 345). It is said that in order to raise the characteristic temperature above 100K, Zn density in the p-type clad layer should be about $2\times10^{18}$cm$^{-3}$. The experiments conducted by the applicants yield the same conclusion.

In the laser device shown in FIG. 1, the thickness of the p-type clad layer (4) (to be more specific, the thickness of that part of the clad layer between the active layer (3) and the current blocking layer (5) is only 0.4 micron. The p-type impurities of Zn doped into the upper clad layer diffuses into both of the adjacent layers during the high temperature phase of the second crystal growth even if the upper clad layer (4) is doped to a high concentration. As a result, these impurities are only doped to a low density in the upper clad layer (4). Moreover, because the diffusion of Zn increases as the Al composition in the GaAlAs layer increases, it is more pronounced in a laser device in which the lasing wavelength is short because the Al composition in the upper clad layer (4) has to be increased for a laser device with a short lasing wavelength. Again, one possible solution would be to considerably raise the initial carrier concentration in the p-type upper clad layer (4) beforehand in anticipation of the probable diffusion of Zn, for example, up to $1\times10^{19}$cm$^{-3}$. In this case Zn, which is doped to a high density, diffuses into the current blocking layer (5) and even into the n-type clad layer (2). This leads to part or all of the layers being inverted to p-type layers. Also, it has been found that the lasing threshold current of the laser rises sharply to several hundred mA. Because of these phenomena, it has proved impossible to raise the p-type carrier density in the p-type upper clad layer (4) above $3\times10^{18}$cm$^{-3}$. Further, it was established that even if the Zn density was pushed to the limit, the characteristic temperature To of the laser device remained low at 100K and that in comparison with the result given in the paper referred to above, the actual carrier density of the p-type upper clad layer (4) was much lower than $2\times10^{18}$cm$^{-3}$.

The problem described above resides in the fact that the p-type clad layer (4) between the active layer (3) and the current blocking layer cannot be made thick enough. In the case where the p-type clad layer has sufficient thickness, the effect would be that even if the Zn in that part of the p-type layer nearest the n-type layer diffused into the n-type layer, the Zn from the rest of the p-type layer would diffuse within the p-type layer. Thus, the Zn which had been lost to the n-type layer is replaced so that the reduction in carrier density in the p-type layer is restrained. Thus it would be possible, if the p-type clad layer could be made thick enough, to achieve a distribution of carrier density close to the distribution at the initial doping. From this point of view, it would be desirable to make the p-type clad as thick as possible. High thickness is prevented, however, due to the conditions required to achieve transverse mode control in the direction parallel to the junction by producing a built-in waveguide effect in the direction parallel to the junction. In the laser of FIG. 1, because the tail of the mode propagated by active layer (3) spreads as far as current blocking layer (5), as shown in FIG. 2, and encounters a complex refraction index different from that of the p-type clad layer (4), the effective refraction index for the mode propagated by active layer (3) is different in the striped or channel part (9) (see FIG. 1) and on both of its sides. As a result, for the mode in the direction parallel to the junction, an equivalent refractive index distribution is produced by the striped part (9) which confines the light. Consequently, in a layer of this structure, it is necessary to limit the thickness of the p-type clad layer (4) (thickness of that part of the clad layer between the active layer (3) and the current blocking layer (5)) so that the tail of the mode which is propagated by active layer (3) spreads as far as current blocking layer (5).

As explained above, a characteristic of the invention is the disposition of an optical waveguide layer between the clad layers, wherein the optical waveguide layer has a refraction index which is greater than that of the clad layers and has a sufficiently large thickness.

If an optical waveguide layer of higher refraction index than the clad layers is disposed between the active layer and the current blocking layer, the spread of the tail of the mode can be increased toward the current blocking layer side of the active layer. It therefore becomes possible to make the optical waveguide layer of p-type material thicker than the conventional p-type clad layer. Furthermore, in experiments conducted by applicants, various types of laser devices were prepared with an Al composition ratio of the active layer selected within the range 0 to 0.2, which provide a lasing wavelength of 760 to 880 nm (nano meters). The Al composition ratio of the optical waveguide layer was varied within the range 0.25 to 0.45 and the thickness of the optical waveguide layer was varied within the range 0.2 to 1.0 micron in order to investigate the characteristic temperature which indicates the temperature dependence of the lasing threshold current. The result of the investigation is shown in FIG. 3. In FIG. 3, the vertical lines show the spread of the data. In the experiment, the carrier density of the optical waveguide layer is $2\times10^{18}$cm$^{-3}$. This is the condition where the lowest lasing threshold current is obtained. Thus, when the carrier density is increased above this level, the lasing threshold current increases.

If the characteristic temperature To of a semiconductor laser is below 100K, its working life at temperatures above 70° C. is markedly reduced to below 1000 hours. If on the other hand, its characteristic temperature To is 140K or above, a working life of more than 10000 hours can be expected. Thus, such a laser is suitable for use with optical discs, e.g., as a DAD light source with a working life of 5000 hours. Further, in a conventional laser where a waveguide is effected by controlling the current flow through the semiconductor device, the characteristic temperature To is usually above 140K which is said to be satisfactory. It can therefore be inferred from FIG. 3 that the thickness of the optical waveguide layer should be more than 0.6 micron.

In the semiconductor laser device of this invention, the distribution of the refractive index in the direction perpendicular to the junction in the striped part (9) (see FIG. 1) is roughly similar to that in a large optical cavity structure. The LOC is generally used to increase the output of a semiconductor laser. Since the peak output light obtainable from a semiconductor laser is determined by the fact that the crystal facet will be damaged when a certain optical flux density in the active layer is reached, a structure in which the confinement of light in the active layer is reduced has the effect of raising the peak output light. In the LOC, the confinement of light is reduced because of the greater leakage of light to the waveguide layer. Consequently the level of output light at which the crystal facet will be damaged is raised.

However, the objective of the structure of the invention is not only to increase light output power, nor is its effect the same as that of an LOC. By the provision of an optical waveguide layer, the invention increases the spread of the tail of the mode and increases the permissible value for the thickness between the active layer and the current blocking layer. This is entirely different in its operation and effect from the usual LOC. Thus, it is clear that the structure of the invention provides a more efficient and easily manufactured laser than is possible with the ordinary LOC.

DETAILED DESCRIPTION OF THE PREFERRED EMBODIMENT

Figure 1:
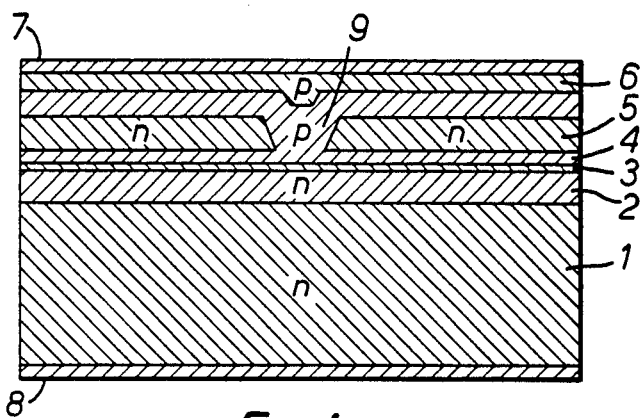
FIG. 1 is a cross-sectional view of a semiconductor laser device known in the prior art.
Figure 2:
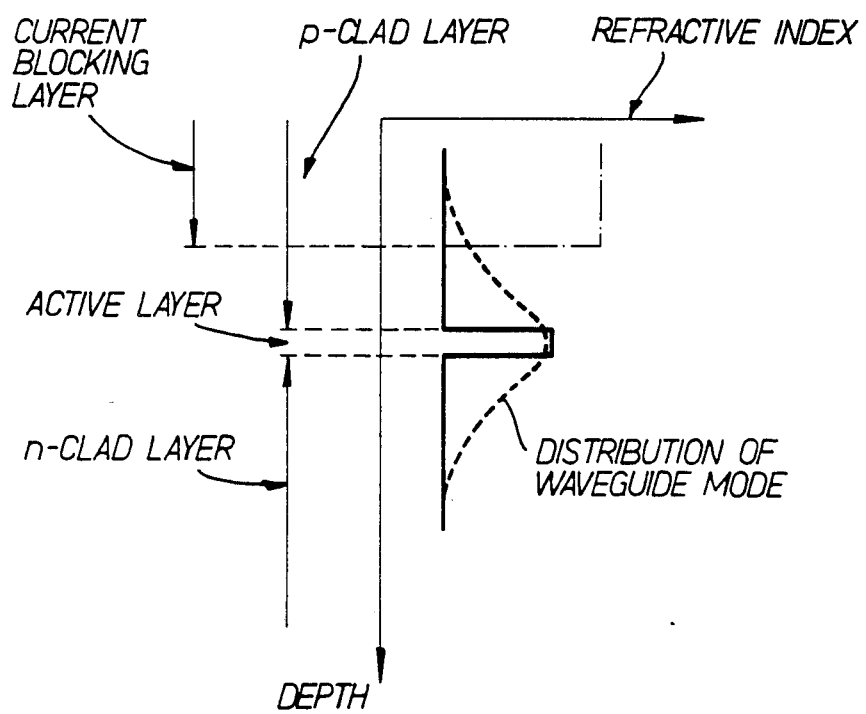
FIG. 2 is a diagram showing the distribution of the refractive index of the semiconductor laser device shown in FIG. 1.
Figure 3:
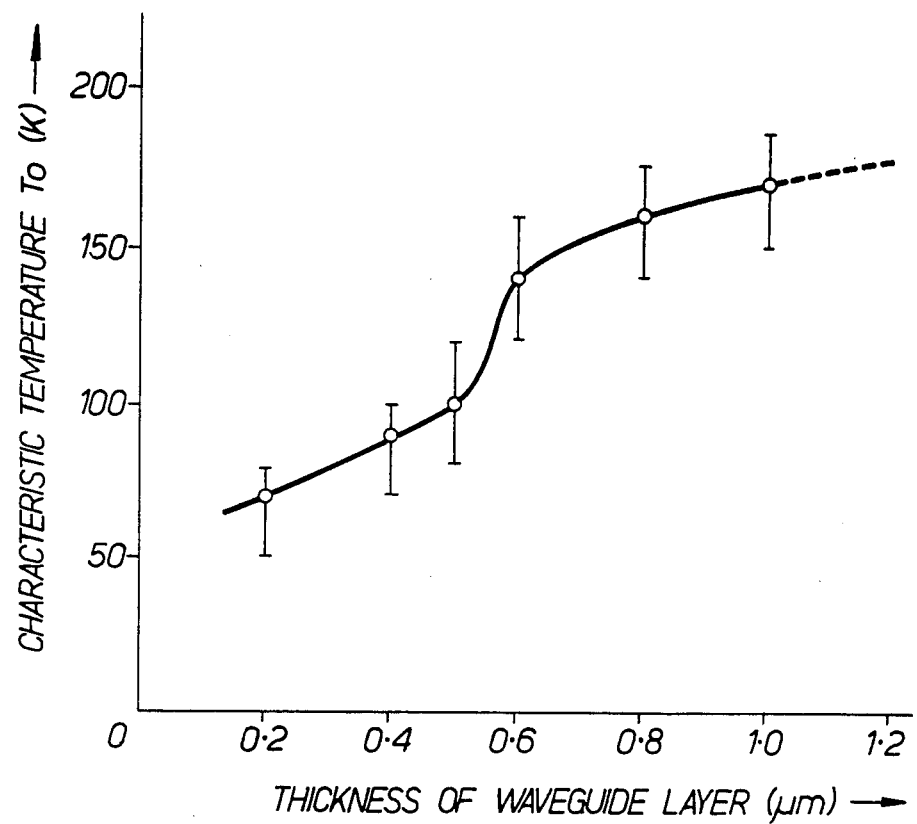
FIG. 3 is a graph showing the relationship between the characteristic temperature To and the thickness of the optical waveguide layer of the invention.

Referring now to the drawings, the present invention will be explained in detail.

Figure 4:
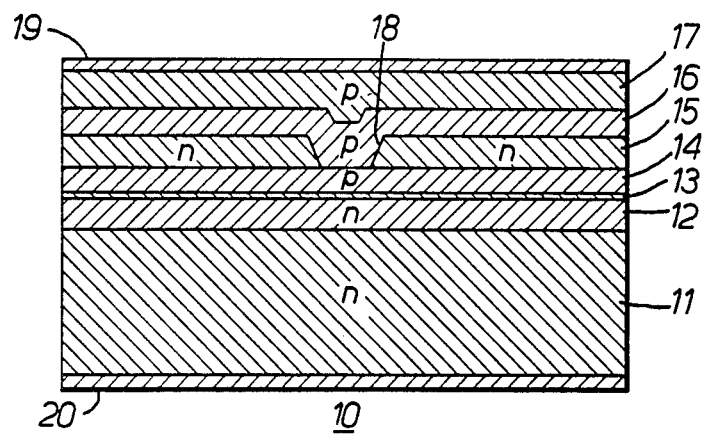
FIG. 4 is a cross-sectional view of the semiconductor layer device of the invention.

FIG. 4 shows a cross-sectional view of the preferred embodiment of the invention in which the semiconductor laser device (10) comprises a $Ga_{0.88}Al_{0.12}As$ active layer (13) in which laser light is exited, p-$Ga_{0.63}Al_{0.37}As$ optical waveguide layer (14) on the active layer (13), n-GaAs current blocking layer (15) separated by striped groove (18) and disposed on the optical waveguide layer (14), n-$Ga_{0.45}Al_{0.55}As$ first clad layer (12) and p-$Ga_{0.45}Al_{0.55}As$ second clad layer (16) confining the laser light in active layer (13), and GaAs substrate (11). Device (10) further comprises a pair of electrodes (19),(20) connected to first clad layer (16) through p-GaAs contact layer (17) and to substrate (11), respectively. In device (10), optical waveguide layer (14) is formed with a thickness of 0.8 micron. Further, the composition ratio of Al of optical waveguide layer (14) is less than that of clad layers (12), (16) so that the refractive index of optical waveguide layer (14) is greater than that of the clad layers (12), (16). It has been found that the refractive index of optical waveguide layer (14) and clad layer (12),(16) are about 3.42 and about 3.29, respectively. Further, the refractive index of active layer (13) is about 3.59.

Figure 5:
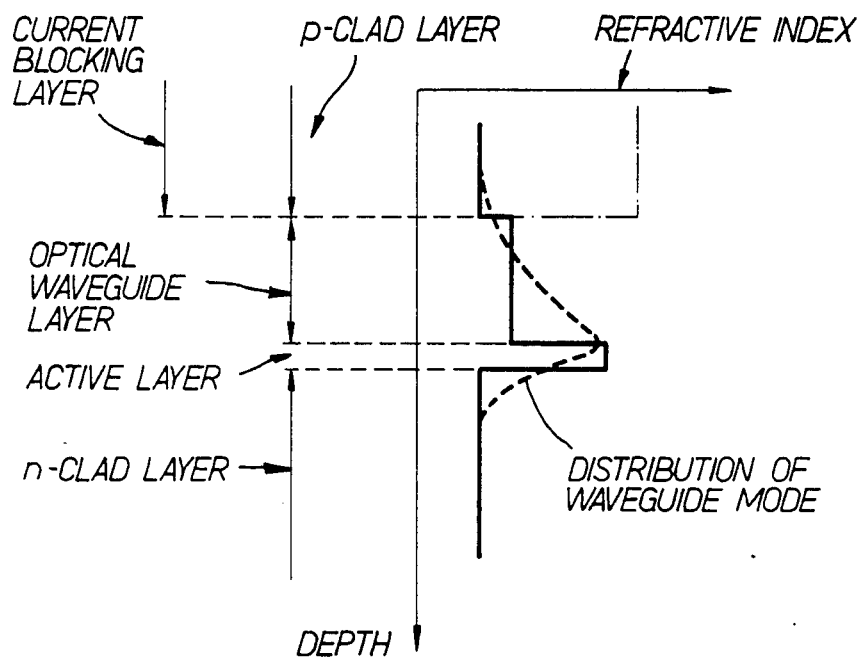
FIG. 5 is a diagram showing the distribution of the refractive index of the semiconductor laser device shown in FIG. 4.

The distribution of the refractive index of semiconductor laser device (10), having the construction explained above, in the direction perpendicular to the junctions between each of the layers is shown in FIG. 5. As seen from FIG. 5, because the refractive index of optical waveguide layer (14) is greater than that of clad layers (12), (16), the spread of the waveguide is greater on the current blocking layer (15) side. As a result, even if optical waveguide layer (14) is made as thick as 0.8 micron, the tail of the mode spreads up to current blocking layer (15). Therefore, a laser is achieved which has good temperature characteristics and a sufficiently large current confinement effect.

Figure 6A:
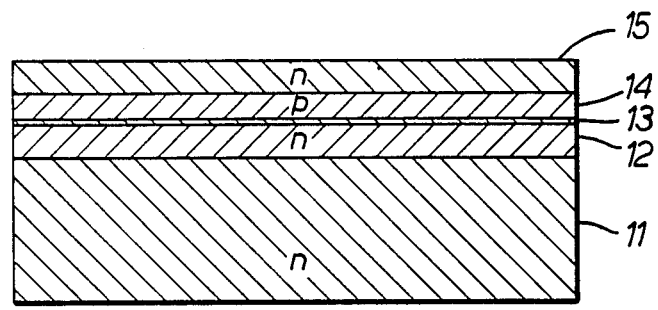
FIG. 6A, 6B, and 6C are cross-sectional views showing the processing of the semiconductor laser device of the invention.
Figure 6B:
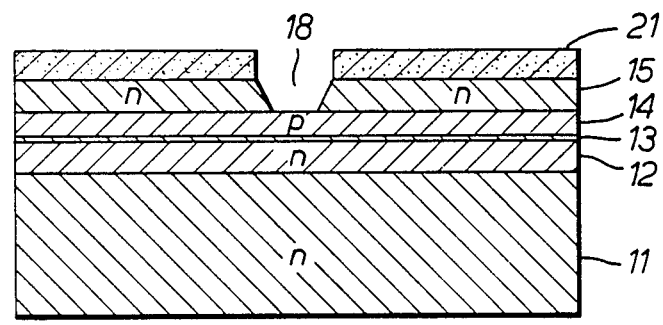
Figure 6C:
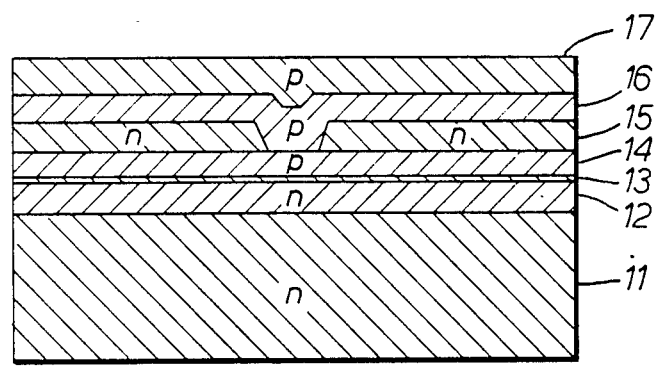

Referring to FIGS. 6A, 6B and 6C the process of manufacture of the semiconductor laser described above will be explained below. FIGS. 6A, 6B and 6C show cross-sectional views of the semiconductor laser device. As shown in FIG. 6A, a n-$Ga_{0.45}Al_{0.55}As$ layer (12) 1.5 microns in thickness is doped by Se with a density of $n=1\times 10^{17}cm^{-3}$, an undoped n-$Ga_{0.88}Al_{0.12}As$ layer (13) 0.08 microns in thickness, a p-$Ga_{0.63}Al_{0.37}As$ layer (14) 1 micron in thickness is doped by Zn with a density of $p=2\times 10^{18}cm^{-3}$, and a n-GaAs layer (15) 1 micron in thickness is doped by Se with a density of $n=5\times 10^{18}cm^{-3}$ are grown in the order mentioned above on a n-GaAs substrate (11) doped by Se with a density of $n=1\times 10^{18}cm^{-3}$ in the (100) crystal plane. For this first crystal growth, the MOCVD process is used which provides a good quality crystal growth over a wide area. The ordinary LPE or MBE process may also be used. Next, as shown in FIG. 6B, a resist (21) is formed on current blocking layer (15), except where the groove is to be formed. Current blocking layer (15) is then selectively etched using resist (21) as a mask to a depth extending to optical waveguide layer (14). Groove (18) having a width of 3 microns is formed in current blocking layer (15) through the process explained above.

Then, as shown in FIG. 6C, by using the MOVCD process, p-$Ga_{0.55}Al_{0.45}As$ layer (16) of thickness 1 micron is doped by a Zn density of $p=5\times 10^{18}cm^{-3}$ and p-GaAs layer (17) of width 3 micron is doped by Zn with a density $p=1\times 10^{18}cm^{-3}$ are grown successively over the whole surface.

Finally, electrodes (19) and (20) are produced by vacuum evaporation of Cr/Au and AuGe-Au on the p-type contact layer (17) and substrate (11), respectively. the wafer is then cut in order to form a cavity of 250 microns. The laser device (10) is thus obtained.

The characteristics of the device obtained in this way is very satisfactory compared with conventional semiconductor laser devices. Namely, the device of the invention has 790 microns of lasing wavelength, 50 mA of threshold current, 20% differential quantum efficiency, 15 mW of current-light output kink, and 20 mW of facet damaging output. Further, the characteristic temperature To, determined by finding the lasing threshold current at different temperatures in the range between 0° and 100° C. with a pulse width of 300 nsec, is 160K. This characteristic temperature of 160K is more than satisfactory in comparison with the To of 100K of the conventional device shown in FIG. 1.

Because of the presence of the optical waveguide layer, the spread of the tail of the mode can be made sufficiently large on the current blocking layer side of the active layer. As a result, the optical waveguide, wherein the density of p-type impurities tend to decrease during the manufacturing process as explained above, can be made sufficiently thick. Consequently, even for a semiconductor laser device, which requires a large Al composition ratio in the clad layer, the characteristic temperature To of the device can be kept to a favorable value (at least 140K), and the current confinement effect can be made sufficiently large. This effect is very useful when the device is used as a light source for an optical disc device.

This invention is not restricted to the embodiment described above. For example, the thickness of the optical waveguide layer is not restricted to 0.8 micron, provided it is at least the 0.6 micron necessary for obtaining the characteristic temperature of 140K. Further, the Al composition ratio of the GaAlAs of the optical waveguide layer is not restricted to the figure given for the embodiment, provided it is less than the Al composition in the clad layers. Again, the materials are not limited to a GaAlAs system, namely, a semiconductor of III-V type compound such as InGaAsP may be used. Further, MEB may be used instead of MOCVD as the crystal growth process. It goes without saying that the novel aspects of the invention can be applied even when using materials which diffuse readily, such as Mg, Be, etc. as the p-type impurities. Other variations are possible, provided the essentials of the invention are not departed from.

What is claimed is:

1. In a semiconductor laser device having a double heterojunction structure made of compound semiconductor materials, said device comprising:

a substrate having a first conductivity type:

a first clad layer formed on said substrate, said first clad layer having said first conductivity type;

an active layer formed on said first clad layer;

an optical waveguide layer formed on said active layer, said optical waveguide layer having a second conductivity type;

a current confinement layer formed on said optical waveguide layer so as to form a stripe-shaped groove extending to the optical waveguide layer in the direction perpendicular to the surface of said current confinement layer, said current confinement layer having said first conductivity type;

a second clad layer formed on said current confinement layer and in said groove, said second clad layer having said second conductivity type; and a pair of electrodes connected to said substrate and said second clad layer, respectively;

wherein said optical waveguide layer has a refractive index greater than the refractive index of said first and second clad layers and has a sufficient thickness so as to maintain the density of the impurities in said optical waveguide layer at least $2 \times 10^{18} cm^{-3}$.

2. A semiconductor laser device according to claim 1, wherein said first conductivity type is n-type and said second conductivity type is p-type.

3. A semiconductor laser device according to claim 1, wherein said first and second clad layer are made of $Ga_{0.45}Al_{0.55}As$ and said optical waveguide layer is made of $Ga_{0.63}Al_{0.37}As$.

4. A semiconductor laser device according to claim 1, wherein the characteristic temperature To of the device is at least 140 K.

5. In a semiconductor laser device having a double heterojunction structure made of compound semiconductor materials, said device comprising:

a substrate having a first conductivity type;

a first clad layer formed on said substrate, said first clad layer having said first conductivity type;

an active layer formed on said first clad layer;

an optical waveguide layer formed on said active layer, said optical waveguide layer having a second conductivity type;

a current confinement layer formed on said optical waveguide layer so as to form a stripe-shaped groove extending to the optical waveguide layer in the direction perpendicular to the surface of said current confinement layer, said current confindement layer having said first conductivity type;

a second clad layer formed on said current confinement layer and in said groove, said second clad layer having said second conductivity type; and a pair of electrodes connected to said substrate and said second clad layer, respectively, wherein said optical waveguide layer has a refractive index greater than the refractive index of said first and second clad layers and the thickness of said optical waveguide layer is greater than 0.6 micron.

6. A semiconductor laser device according to claim 5 wherein said first conductivity type is n-type and said second conductivity type is p-type.

7. A semiconductor laser device according to claim 5 wherein said first and second clad layers are made of $Ga_{0.45}Al_{0.55}As$ and said optical waveguide layer is made of $Ga_{0.63}Al_{0.37}As$.

8. A semiconductor laser device according to claim 5 wherein characteristic temperature To of the device is at least 140K.

* * * * *